United States Patent [19]

Remy

[11] 4,225,830
[45] Sep. 30, 1980

[54] PLURAL PHASE LOCKED LOOP FREQUENCY SYNTHESIZER

[75] Inventor: Joël Rémy, Paris, France

[73] Assignee: Adret Electronique, France

[21] Appl. No.: 967,752

[22] Filed: Dec. 8, 1978

[30] Foreign Application Priority Data

Dec. 23, 1977 [FR] France .............................. 77 38954

[51] Int. Cl.$^2$ ............................................. H03B 3/04
[52] U.S. Cl. ........................................ 331/2; 331/25
[58] Field of Search ...................... 331/2, 1 A, 18, 25

[56] References Cited

U.S. PATENT DOCUMENTS

| | | | |
|---|---|---|---|
| 3,268,831 | 8/1966 | Noordanus et al. ...................... | 331/2 |
| 3,319,178 | 5/1967 | Broadhead, Jr. ........................ | 331/2 |

Primary Examiner—Siegfried H. Grimm
Attorney, Agent, or Firm—William Drucker

[57] ABSTRACT

A frequency synthesizer with multiple phase control loops offers the facility of a wide range of frequency adjustment without any discontinuity effects either in frequency or amplitude, and includes at least three phase-controlled oscillators, the first effecting the generation of the smaller steps, the second that of the large steps and the third adding algebraically the frequencies of the two first. On a positive increment of the output frequency, the frequency of the first oscillator ($O_1$) increases and then decreases, and so on, in two successive perfectly linked modes of operation. The synthesizer may be applied to the construction of a programmable wobbulator.

3 Claims, 1 Drawing Figure

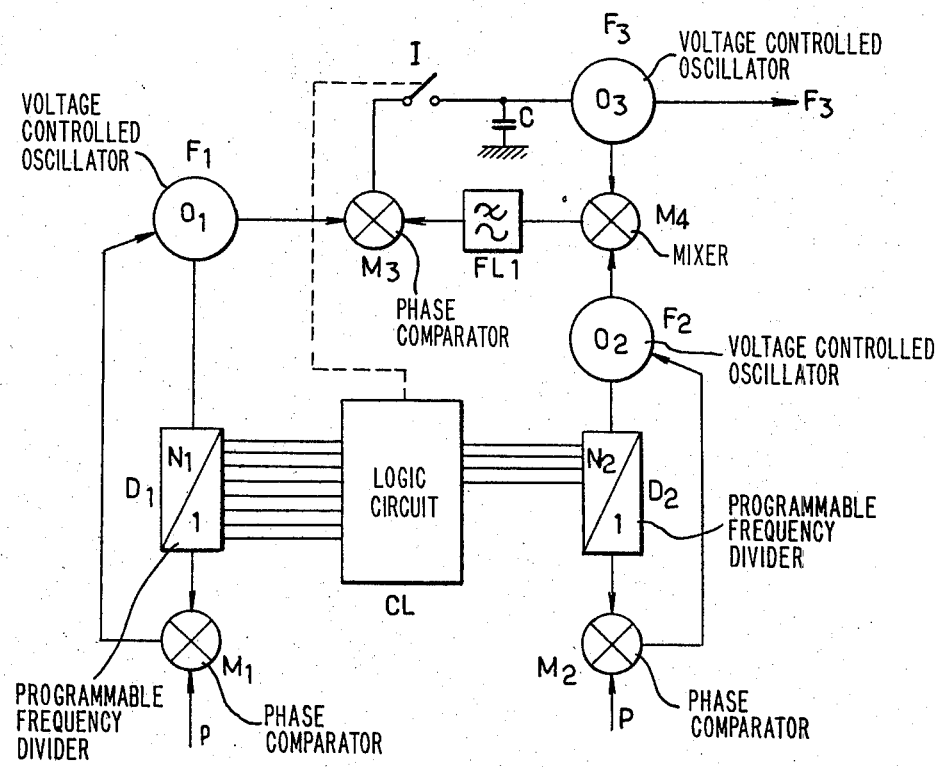

PLURAL PHASE LOCKED LOOP FREQUENCY SYNTHESIZER

BACKGROUND OF THE INVENTION

The invention relates to digitally programmed frequency synthesizers and, more particularly, those which include at least one first phase control loop generating small frequency steps, a second loop generating greater steps, and a third loop arranged in such a way as to give the algebraic sum of the frequencies generated by the two first loops.

Such synthesizers allow discrete frequency scanning, step by step, over a range very much greater than that which is practicable with a single loop and that with good resolution and with a satisfactorily pure waveform. They can thus, in particular, be used in the construction of programmable wobbulators or generators in which the frequency is set manually, for example, by means of a knob.

Known circuits of this type, however, have considerable drawbacks.

The first results from the fact that the oscillator of the first loop returns abruptly to its frequency of origin every time the frequency of the oscillator of the second loop progresses one step. As it is impossible in practice to achieve strict synchronism between the return of the first oscillator to its frequency of origin and the step of the second oscillator, and as the times required for the two oscillators to come together are not identical, there is a discontinuity during the transition between the large steps which can be considerable in the increase in the output frequency from the synthesizer.

The second drawback reveals itself when it is desired to reduce the importance of the first, which is done by constructing the control loops in such a way that their transient times are very short. The jump in frequency which is apparent during transition is then much reduced, but more abrupt, and when it is passed through a circuit with limited passband (which is the case when there are filters present), there results a damped oscillation of a frequency equal to the value of the jump. In other words the synthesized signal is amplitude-modulated, which is extremely troublesome.

OBJECT OF THE INVENTION

The invention is intended to eliminate these disadvantages.

SUMMARY OF THE INVENTION

In accordance with an important feature of the invention, the circuit contains means for programming the frequency of oscillation of the first loop so that, in a continuous range of increasing values of the frequency to be synthesized, the said first frequency increases and decreases alternately by a definite number of small steps, so as to pass through a maximum and a minimum, and means for programming the frequency of the oscillator of the second loop so that, at each of the successive maxima of the first frequency, the said second frequency assumes values lower than the frequency to be synthesized and so that, at each of the successive minima of the first frequency, the second frequency assumes values higher than the frequency to be synthesized.

Instead of making a considerable jump at each large step, the first frequency thus only varies by a small step. When it is desired to achieve a continuous increase in output frequency, in the sub-ranges where the first frequency is increasing, the second frequency is programmed to a value lower than the frequency to be synthesized, with the result that the third loop effects the summation of the two frequencies. In the sub-ranges where the first frequency is decreasing, it is clearly necessary to subtract it from the second so as to obtain an increasing difference and this is why the second frequency must be greater than the frequency to be synthesized.

According to another feature of the invention, the circuit includes means for interrupting the operation of the third loop, and for fixing at the value attained the frequency of the third oscillator during the transition between two successive values of the second frequency.

Other features, as well as the advantages of the invention, will appear clearly in the light of the following description.

BRIEF DESCRIPTION OF THE DRAWING

The single FIGURE of the drawing is a block circuit diagram.

DESCRIPTION OF THE PREFERRED EMBODIMENT

In the sole FIGURE in the accompanying drawing, a first phase control loop has been shown comprising an oscillator $O_1$ generating a frequency $F_1$, followed by a programmable frequency divider $D_1$ of division ratio $N_1$, followed in turn by a phase comparator $M_1$ receiving a reference frequency p, the output of which controls the frequency of the oscillator $O_1$.

A second phase control loop includes an oscillator $O_2$ generating a frequency $F_2$. It is followed by a programmable frequency divider $D_2$ of ratio $N_2$, followed in turn by a phase comparator $M_2$ receiving a reference frequency P and controlling the frequency of the oscillator $O_2$.

A third phase control loop includes oscillator $O_3$ generating a frequency $F_3$. This is followed by a mixer $M_4$ which receives in addition the frequency of the oscillator $O_2$. The output of the mixer $M_4$, after passing through a band-pass filter $FL_1$, enters a phase comparator $M_3$ which receives in addition the frequency of the oscillator $O_1$ and the output of which controls the frequency of the oscillator $O_3$.

The circuit which has just been described is of a type generally known in itself.

It is clear that the output frequency $F_3$ is of the form:

$$F_3 = F_2 \pm F_1$$

As an example, in order to cover the range 100–200 MHz in steps of 1 kHz, an oscillator $O_1$ is used having a frequency variable in steps of 1 kHz between 20 and 25 MHz and an oscillator $O_2$ having a frequency variable between 80 MHz and 220 MHz in steps P of 10 MHz, with the following programme:

For $F_3$ varying from 100 to 105 MHz:
$F_2 = 80$ MHz; $F_1$ varies from 20 to 25 MHz; $F_3 = F_2 + F_1$ For $F_3$ varying from 105 MHz to 110 MHz:
$F_2 = 130$ MHz; $F_1$ varies from 25 to 20 MHz; $F_3 = F_2 - F_1$ For $F_3$ varying 110 to 115 MHz:
$F_2 = 90$ MHz; $F_1$ varies from 20 to 25 MHz; $F_3 = F_2 + F_1$ and so on up to:

For $F_3$ varying from 195 to 200 MHz:
$F_2=220$ MHz; $F_1$ varies from 25 to 20 MHz; $F_3=F_2-F_1$ It is this type of programme which constitutes the principal feature of the circuit.

The means for carrying it out consist of a logic circuit CL, which controls the divider $D_1$ in such a way that the ratio $N_1$ can be programmed successively so that $F_1$ varies alternately from 20 to 25 MHz and from 25 to 20 MHz and controls the divider $D_2$ so that $F_2$ passes successively through the values 80 MHz; 130 MHz; 90 MHz; 140 MHz ... 220 MHz, which are alternately lower and higher than the frequencies of each of the sub-ranges to be synthesized. In this way it is possible to obtain a regular continuous increase in the frequency $F_3$, from 100 to 200 MHz, without the frequency $F_1$ returning abruptly to its minimum value at each change of the value of $F_2$, that is to say without any frequency jump in $F_1$.

It may be noted that at each reversal of the direction of variation of $F_1$, the oscillator $O_2$ undergoes a frequency variation which corresponds to a positive or negative jump. This jump automatically causes an inversion of the sign of the algebraic sum of the frequencies $F_1$ and $F_2$ given by the third loop. In fact, the filter $FL_1$ transmits, in the example considered, the band 20 to 25 MHz. When $F_3=105$, $F_2=80$, and it is the difference $F_3-F_2$ which is transmitted by the filter. The frequencies being equal at the inputs to the comparator $M_3$, the result is that $F_1=F_3-F_2$ from which $F_3=F_2+F_1$. When $F_2$ jumps to 130, $F_3=105$, it is clearly the difference $F_2-F_3$ which is transmitted. The result is that $F_1=F_2-F_3$, or $F_3=F_2-F_1$.

According to another feature of the invention, advantageously associated with the preceding one, a switch I, controlled by the logic circuit CL, is interposed between the phase comparator $M_3$ and the oscillator $O_3$ and only opens at the moment when $O_2$ begins to make a jump in frequency, and closes when $O_2$ has reached its new value. A Capacitor C in parallel across the frequency-control input of $O_3$, stores the voltage corresponding to the preceding value of $F_2$ (the oscillators obviously being of the type in which the frequency is controlled by voltage). In other words, during the transition of $F_2$, the frequency of $F_3$ keeps its former value and runs no risk of varying abruptly or of undergoing an amplitude modulation, as is produced in hitherto known circuits, as has been explained above.

It is appropriate to note that, because of the fact that the circuit which has been described eliminates all risk of spurious modulation, the phase-control loop of oscillator $O_2$ can be very rapid. That of the oscillator $O_1$ will evidently have a transient time compatible with the speed of frequency scanning of the circuit. For example, it could be equal to 100 μsec.

As a result, during the very brief opening of the switch, I, the frequency $F_1$ will itself not have undergone any variation.

The practical realization of a logic circuit CL capable of programming the dividers $D_1$ and $D_2$ and of controlling the switch I is within the capability of the professional man.

For example, it could contain a counter/down-counter associated with a clock and supplying to the divider $D_1$ the codes corresponding to the first frequencies increasing and decreasing respectively, a memory supplying suitable codes to the divider $D_2$ so that the second frequency obeys the variation law specified, and a coincidence circuit actuating an electronic type switch I at the desired instants.

It goes without saying that the numerical values of frequency given above are in no way limiting. Furthermore the means of programming are not necessarily designed to give sequential scanning of the whole range of output frequencies. Finally, the number of loops can be greater than three and the circuit can be constructed in numerous different ways.

I claim:

1. A frequency synthesizer comprising: a first phase locked loop including: a first voltage controlled oscillator having an output and a control input, a first programmable frequency divider having an input connected at the output of the first oscillator, said first programmable frequency divider further having an output, and a first phase comparator having a first input connected to the output of the said first programmable frequency divider, a second input on which a first reference frequency is applied and an output connected to the control input of said first oscillator, said first loop generating small frequency steps; a second phase locked loop including : a second voltage controlled oscillator having an output and a control input, a second programmable frequency divider having an input connected to the output of the second oscillator, said second programmable frequency divider further having an output, and a second phase comparator having a first input connected to the output of the said second programmable frequency divider, a second input on which a second reference frequency larger than the said first reference frequency is applied and an output connected to the control input of said second oscillator, said second loop generating greater frequency steps, and a third phase locked loop including: a third voltage controlled oscillator having an output and a control input, a mixer having a first input connected to the output of the third oscillator, a second input connected to the output of the second oscillator and an output, a third phase comparator having a first input connected to the output of the said mixer, a second input connected to the output of the first oscillator and an output, and means connecting the output of the third phase comparator to the control input of the third oscillator, whereby the third oscillator generates the algebraic sum of the first and second frequencies respectively generated by the first and second oscillators, characterized by circuit means for programming the division ratio of the first frequency divider so that, over a continuous range of increasing values of the frequency to be synthesized at the output of the third oscillator, the said first frequency increases and decreases alternately by a fixed number of small steps, in such a way as to pass through a maximum and a minimum, said circuit means further programming the division ratio of the second frequency divider so that at each of the successive maxima of the first frequency, the said second frequency assumes values lower than the frequency to be synthesized, and that at each of the successive minima of the first frequency, the second frequency assumes values higher than the frequency to be synthesized.

2. A frequency synthesizer, according to claim 1, wherein said means connecting the output of the third phase comparator to the control input of the third oscillator include means for stopping the operation of the third oscillator and for keeping at the attained value the frequency of the third oscillator during the transition between two successive values of the second frequency.

3. A frequency synthesizer, according to claim 2, wherein said means for stopping the operation of the third oscillator consist of a switch controlled by the said circuit means, and wherein said means for keeping the frequency of the third oscillator at the attained value consist of a capacitor connected in parallel across the control input of the third oscillator.

* * * * *